United States Patent [19]

Machida et al.

[11] Patent Number: 4,882,767
[45] Date of Patent: Nov. 21, 1989

[54] STABILIZED TRANSMITTER

[75] Inventors: Takashi Machida, Osaka; Kou Miyake, Takatsuki; Hirotaka Fujisaki, Neyagawa; Hiroshi Mouri, Ibaraki, all of Japan

[73] Assignee: Matsushita Electric Industrial Co., Ltd., Osaka, Japan

[21] Appl. No.: 220,670

[22] Filed: Jul. 18, 1988

[51] Int. Cl.$^4$ .............................. H01Q 11/12
[52] U.S. Cl. .................... 455/117; 455/115; 330/289
[58] Field of Search ............ 455/117, 115, 118, 67, 455/127, 249; 330/280, 278, 289, 282, 207 P

[56] References Cited

U.S. PATENT DOCUMENTS

| | | | |
|---|---|---|---|
| 4,158,180 | 6/1979 | Challen | 330/298 |
| 4,563,775 | 1/1986 | Yokosuka | 455/126 |
| 4,710,815 | 12/1987 | Douglas et al. | 455/108 |

OTHER PUBLICATIONS

Revised Satellilte Communication, p. 166, Corona Publishing Co., 1985.
Microwave Circuit for Communications, p. 371, The Institute of Electronics and Communication Engineers, 1981.
1986 Conference of the Institute of Electronics, Information and Communication Engineers, Regime p.3-264, P.3-265.

*Primary Examiner*—Benedict V. Safourek
*Assistant Examiner*—Frederic R. Jorgenson
*Attorney, Agent, or Firm*—Wenderoth, Lind & Ponack

[57] ABSTRACT

A stabilized transmitter includes a gain converter that varies its gain according to an electrical signal; a power amplifier that amplifies a high-frequency signal passed through the gain converter; and a compensator having a temperature sensor which detects the temperature of the power amplifier for producing from a detection result of the temperature sensor the electrical signal applied to the gain converter so as to thereby to compensate for variations of the gain of the power amplifier caused by temperature variations. The compensator is adjusted in advance so that the gain of the power amplifier at a reference temperature becomes a predetermined value.

5 Claims, 3 Drawing Sheets

4,882,767

STABILIZED TRANSMITTER

BACKGROUND OF THE INVENTION

1. Field of the Invention

This invention relates to a stabilized transmitter used for microwave communication equipment.

2. Description of the Prior Art

A high-frequency transmitter in microwave equipment requires high gain stability against temperature variations.

In general, the high-frequency transmitter comprises an up converter that converts an intermediate-frequency signal into a high-frequency signal and a power amplifier that amplifiers the power of the high-frequency signal. In recent years, power amplifiers using semiconductors (SSPA: Solid-State Power Amplifier) have been popularly used. Such power amplifier comprises a number of semiconductor amplifier elements, and their gains have temperature characteristics as well as variations during manufacturing.

In the prior art, to compensate for temperature-dependent gain variations of the power amplifier, a temperature sensor is provided in the power amplifier, and a variable attenuator is provided in the up converter to achieve gain stability.

On the other hand, since gains of power amplifiers at room temperature vary depending on the manufacturing conditions, a semi-fixed attenuator is provided either on the inside or outside of the up converter, and this semi-fixed attenuator is adjusted such that the total transmission gain of the transmitter becomes a desired gain (see Revised Satellite Communication, P. 166, Corona Publishing Co., 1985; Microwave Circuit for Communications, P. 371, The Institute of Electronics and Communication Engineers, 1981; 1986 Conference of the Institute of Electronics, Information and Communication Engineers, Regime P. 3-264, P. 3-265).

In such a conventional configuration, the aforementioned semi-fixed attenuator must be readjusted to obtain the desired transmission gain when the power amplifier or up converter unit is replaced by a new one due to failure of the up converter or power amplifier unit. In addition, the transmission gain of the transmitter including the up converter, power amplifier, and variable attenuator must be adjusted after being fabricated.

SUMMARY OF THE INVENTION

Accordingly, it is an object of the present invention to provide a stabilized transmitter that does not require readjustment when a power amplifier or an up converter unit is replaced by a new one, and does not require adjustment of the transmission gain when the transmitter is fabricated.

To accomplish this object, a stabilized transmitter of this invention comprises a gain conversion means that allows the gain to be varied by an external electric signal, a power amplifier that amplifies the power of a high-frequency signal, a temperature detecting means that detects the temperature of the power amplifier, and a compensating means that produces from an electrical signal outputted from the temperature detection means the electric signal applied to the gain conversion means. The output terminal of the gain conversion means is connected to the input terminal of the power amplifier, and a high-frequency transmission signal is taken out from the output terminal of the power amplifier. The compensating means adjusts in advance the gain of the transmitter to attain a predetermined gain at a reference temperature, and compensates for a gain change of the power amplifier with respect to a temperature variation. This configuration allows the gain conversion means to compensate for gain deviations of the power amplifier from a desired value even when the power-amplifier gain at room temperature may differ from the desired value during fabrication, and at the same time allows the gain conversion means to compensate for a change of the power-amplifier gain when the ambient temperature changes, thereby eliminating readjustment of the gain converter or the power amplifier with the gain conversion means when either of them is replaced by a new one. In addition, there is no need for adjustment of the transmission gain when the transmitter is fabricated.

DETAILED DESCRIPTION OF THE PREFERRED EMBODIMENTS

Figure 1:
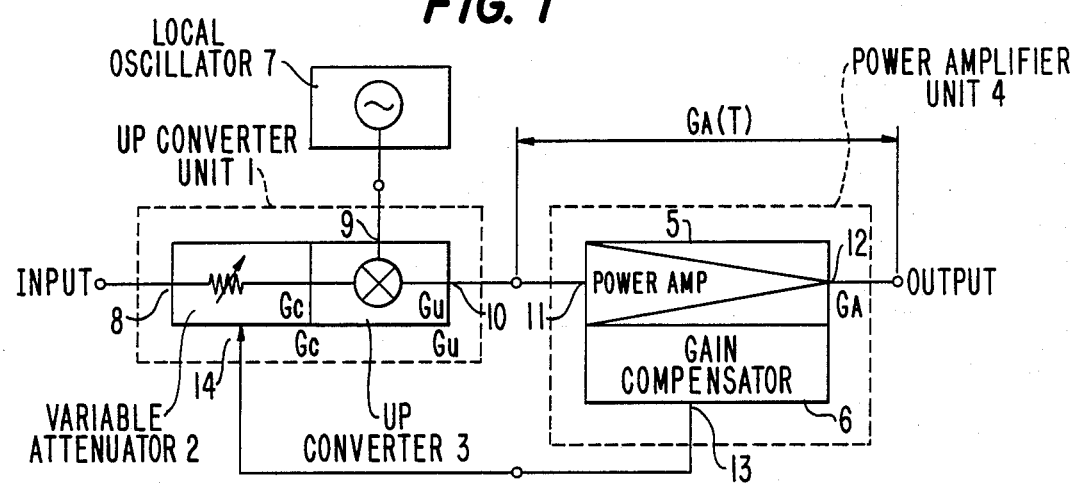
FIG. 1 is a schematic block diagram of a stabilized transmitter in accordance a first embodiment of the present invention.

Referring now to the drawings, the first embodiment according to the present invention will be described in detail hereinafter.

FIG. 1 is a circuit block diagram of the first embodiment of the present invention. An intermediate-frequency signal inputted into an input terminal 8 of an up converter unit 1 passes through a voltage-controlled variable attenuator 2 that varies the attenuation rate according to a DC voltage applied thereto through a terminal 14, and is supplied to an up converter 3. A local oscillation signal from a local oscillator 7 is added to a terminal 9, so that the intermediate-frequency signal is converted to a high-frequency signal appearing at a terminal 10. This high-frequency signal is inputted into an input terminal 11 of a power amplifier 5 in a power amplifier unit 4 to be power-amplified, and taken out from an output terminal 12 as a transmission signal, which is sent out to an antenna line. On the other hand, a gain compensator 6 in the power amplifier unit 4 contains a temperature sensor, and generates a DC voltage at a terminal 13 which is applied to the terminal 14 of the voltage-controlled variable attenuator 2 to compensate for a difference between the gain of the power amplifier 5 and a desired gain so as to thereby stabilize the transmission gain. At this point, the voltage-controlled variable attenuator functions as a gain conversion means.

Figure 2:
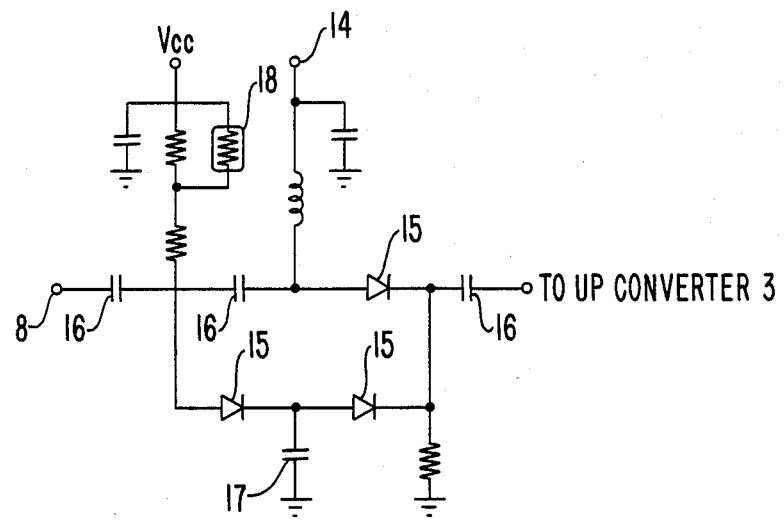
FIG. 2 is a circuit diagram of a voltage controlled variable attenuator.

FIG. 2 shows a π-type variable attenuator using PIN diodes as an example of the voltage-controlled variable attenuator. Three PIN diodes 15 form a π-type resistor attenuator, which attenuates an input signal inputted to the terminal 8 according to a DC voltage applied to the terminal 14. This attenuator has a DC blocking capacitor 16 and a bypass capacitor 17. A resistor 18 is a thermister used to adjust the temperature characteristics. This configuration allows the up converter unit to be stable against variations of the ambient temperature, and to linearly change the conversion gain according to the external DC voltage.

Figure 3:
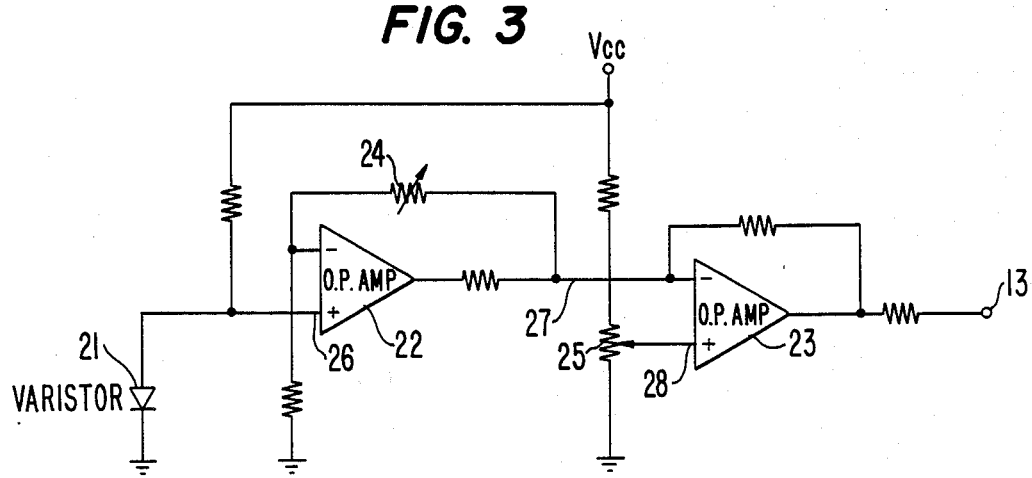
FIG. 3 is a circuit diagram of a gain compensator including a temperature sensor.

FIG. 3 shows an example of the gain compensator 6. A varistor 21 is located as a temperature sensor near the power amplifier, and is connected to one input terminal 26 of an operational amplifier 22. A variable resistor 24 changes the gradient of change of the output voltage of the operational amplifier 22 with respect to temperature variation. The output voltage of the operational amplifier 22 appearing at a terminal 27 is applied to another operational amplifier 23 having at another input terminal 28 corrected to a variable resistor 25. The variable resistor 25 is used to change the gain of the operational amplifier 23 at a reference temperature. The DC voltage for gain compensation is taken out from the terminal 13.

Figure 4:
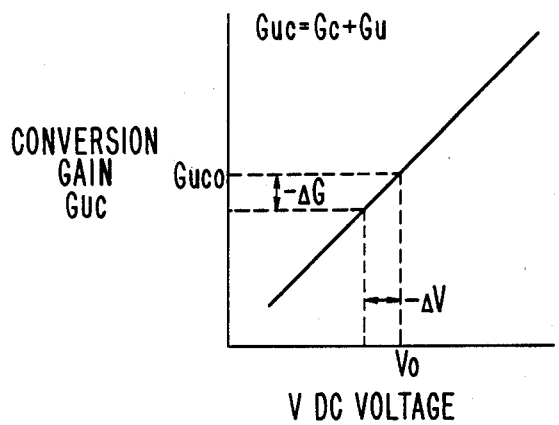
FIG. 4 is a characteristic diagram of the conversion gain of the up converter unit with respect to an external DC voltage applied thereto.
Figure 5A:
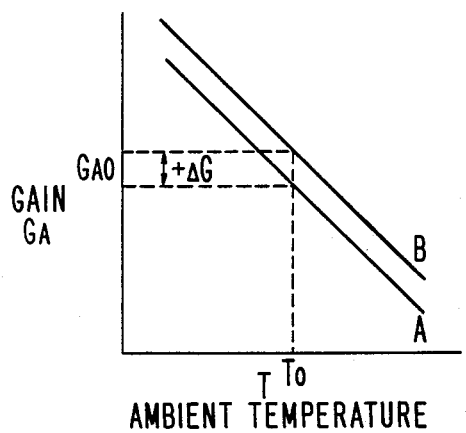
FIGS. 5(a) and 5(b) are characteristic diagrams of the gains of two power amplifier units with respect to the ambient temperature and of the output voltages of two gain compensators in the respective power amplifier units with respect to the ambient temperature, respectively, when the two power amplifier units are different in gain at a reference temperature from each other and are the same in the gradient of the temperature characteristic.
Figure 5B:
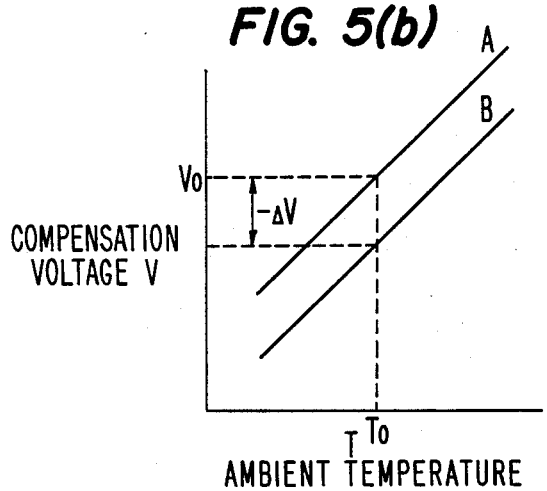
Figure 6:
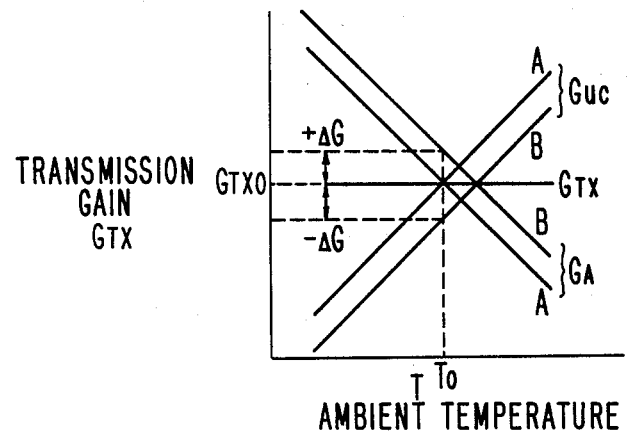
FIG. 6 is a characteristic diagram of the transmission gain with respect to the ambient temperature, which is the sum of the gains of the up converter unit and the power amplifier unit.

FIG. 4 is a characteristic diagram of the conversion gain $G_{UC}$ of the up converter unit 1, which is a sum of the gain $G_C$ of the voltage-controlled variable attenuator 2 and the conversion gain $G_U$ of the up converter 3, with respect to the DC voltage V applied to the terminal 14 of the up converter 1. FIG. 5(a) is a characteristic diagram plotting the gains $G_A$ of two power amplifier units with respect to ambient temperature T, and FIG. 5(b) is a characteristic diagram of the gain compensation voltages V outputted from two gain compensators in the respective power amplifier units plotted with respect to the ambient temperature T. FIG. 6 is a characteristic diagram of transmission gain $G_{TX}$, the sum of the conversion gain $G_{UC}$ of the up converter and the gain $G_A$ of the power amplifier in each of the cases in which the two power amplifier units having the characteristics shown in FIGS. 5(a) and 5(b) are respectively used. Symbols A and B in FIGS. 5(a), 5(b) and FIG. 6 represent the characteristics of the respective power amplifier units which have different gains $G_{AO}$ and $G_{AO}+\Delta G$ measured at room temperature as a reference temperature and have the same gradient of gain variation with respect to temperature variations.

Figure 7A:
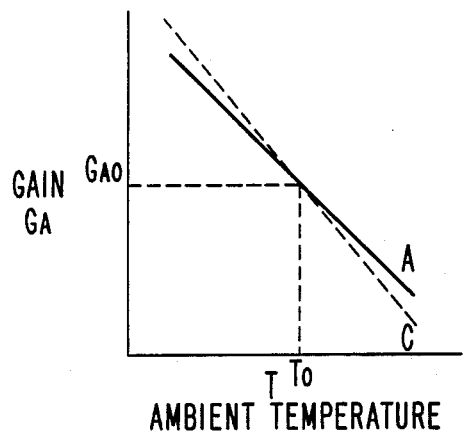
FIGS. 7(a) and 7(b) are characteristic diagrams of the gains of two power amplifier units with respect to the ambient temperature and of the output voltages of two gain compensators in the respective power amplifier units with respect to the ambient temperature, respectively, when the two power amplifier units are same in gain at a reference temperature and are different in the gradient of the temperature characteristic.
Figure 7B:
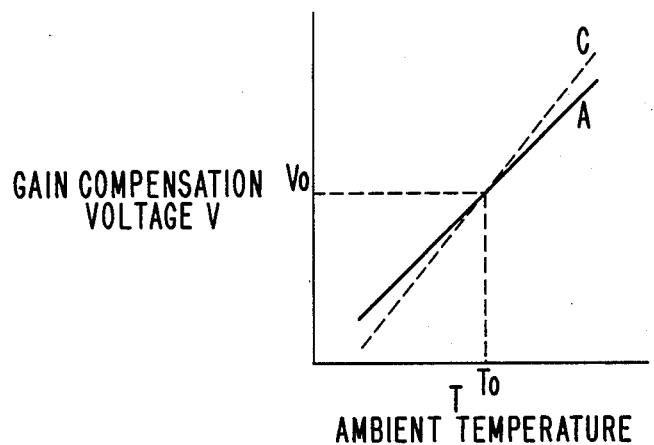

FIG. 7(a) is a characteristic diagram of the gains $G_A$ with respect to the ambient temperature of two power amplifier units which have the same gain at the room temperature To and have different gradients of gain variation with respect to temperature variations as shown by symbols A and C, and FIG. 7(b) is a characteristic diagram of the gain compensation voltages V with respect to ambient temperature T of two gain compensators in the respective power amplifier units.

Assume that the desired gain of the power amplifier is $G_{AO}$, and the desired conversion gain of the up converter is $G_{UCO}$. That is, the desired total gain of the transmitter is the sum of $G_{AO}$ and $G_{UCO}$.

First discussed is the case where the measured value of the gain $G_A$ of the power amplifier 4 is $G_{AO}$ when the reference ambient temperature is the room temperature (basic case). Under the room temperature, the gain compensator outputs a DC voltage Vo so that the conversion gain of the up converter may be equal to $G_{UCO}$ in accordance with FIG. 5(b). Consequently, the transmission gain of the transmitter at room temperature To is expressed as:

$$G_{TXA}(T_O) = G_{UCO} + G_{AO}.$$

When the ambient temperature varies, the gain of a power amplifier using an FET (Field Effect Transistor) possesses, in general, a negative temperature coefficient $\tau_A(=-\Delta G_A/\Delta T)$. Such a temperature characteristic is shown in FIG. 5(a). In this case, the value $\tau_A$ of one power amplifier is different from that of another power amplifier as shown in FIG. 7(a). To cancel variations due to this temperature coefficient $\tau_A$ of the power amplifier, the variable resistor 24 in the gain compensator shown in FIG. 3 is adjusted to generate a DC voltage having the temperature characteristic as shown in FIG. 7(b). The temperature coefficient of this DC voltage is designated as $\tau_V(=\Delta V/\Delta T)$, which is determined as follows:

The transmission gain $G_{TX}$ is expressed by the following equation:

$$G_{TX}(T) = G_{UC}[V(T)] + G_A - (T) \tag{1}$$

From Eq. (1), the temperature coefficient of $G_{TX}$ is given by $$\frac{\Delta G_{Tx}}{\Delta T} = \frac{\Delta G_{UC}}{\Delta V} \cdot \frac{\Delta V}{\Delta T} + \frac{\Delta G_A}{\Delta T} \tag{2}$$
$$= \delta_{UC} \cdot \tau_v - \tau_A$$

Here, $\delta_{UC}(=\Delta G_{UC}/\Delta V)$ is a temperature coefficient of the conversion gain of the up converter, which should be set to a proper value in advance.

Consequently, by setting $\tau_V$ to be $$\delta_{UC} \cdot \tau_V = \tau_A \tag{3}$$

we obtain, $$\frac{\Delta G_{Tx}}{\Delta T} = 0 \tag{4}$$

That is, the transmission gain of the transmitter can be constant irrespective of the ambient temperature.

Next, when the measured gain $G_A$ of the power amplifier is $G_{AO}+\Delta G$ as shown by the straight line B in FIG. 5(a) at room temperature, the compensation voltage outputted from the gain compensator deviates by $-\Delta V$ from that of the above-mentioned basic case by adjusting the variable resistor 25 in the gain compensator shown in FIG. 3 as represented by the straight line B in FIG. 5(b). This means that the gain deviation $\Delta G$ from the above-mentioned basic case is compensated at $T=T_o$ by the voltage-controlled variable attenuator 2. In such a case, $$G_A(T_o) = G_{AO} + \Delta G,$$

$$V(T_o) = V_O - \Delta V,$$

$$G_{UC}(V_O - \Delta V) = G_{UCO} - \Delta G \quad (5)$$

From Eq. (1) and Eq. (5), the transmission gain $G_{TXO}$ becomes as follows:

$$\begin{aligned} G_{Tx}(T_o) &= G_{UC}[V(T_o)] + G_A(T_o) \\ &= G_{UC}(V_o - \Delta V) + G_{AO} + \Delta G \\ &= G_{UCO} - \Delta G + G_{AO} + \Delta G \\ &= G_{UCO} + G_{AO} \end{aligned} \quad (6)$$

That is, the temperature characteristic of the transmission gain can be stabilized in the same manner as in the basic case. This behavior is expressed with the symbol B in FIGS. 5(a), 5(b), and FIG. 6. Consequently, even if the power amplifier gain differs at room temperature, the transmission gain is always kept constant irrespective of temperature.

Figure 8:
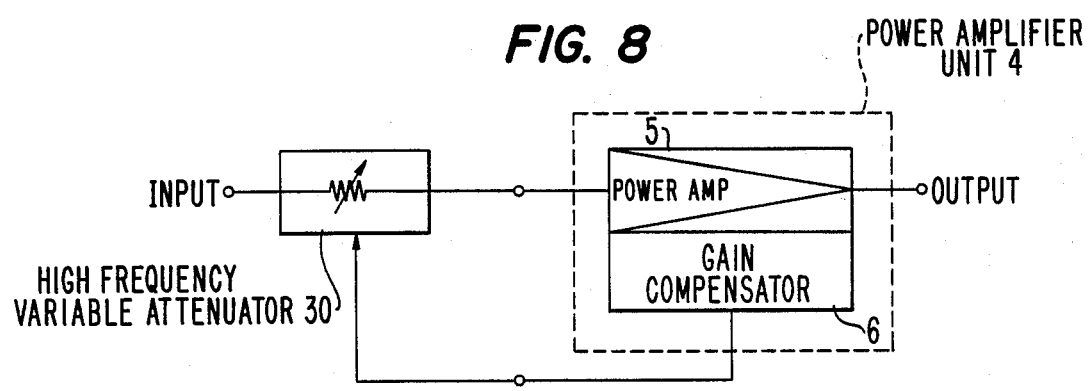
FIG. 8 is a schematic block diagram of a second embodiment in accordance with the present invention.

The second embodiment of the present invention will be described hereafter. FIG. 8 is a block diagram of the second embodiment of in accordance with the present invention. A high-frequency range variable attenuator 30 varies the attenuation rate according to an external DC voltage. In this case, the input signal of the transmitter is a high-frequency signal, requiring no up converter.

In the first embodiment the power amplifier gain in the high-frequency range is compensated by the intermediate-frequency range variable attenuator, while in the second embodiment this compensation is performed in the same frequency range as that of the power amplifier.

Consequently, gains can be compensated for in a manner similar to that shown above, and gain variations during fabrication of the power amplifier and temperature change can be compensated for by the gain compensator 30.

In the above description, a variable attenuator that varies its attenuation rate according to the external DC voltage is used for a gain conversion means, but a variable amplifier that varies its gain according to the external DC voltage can be also used.

What is claimed is:

1. A stabilized transmitter comprising;
   a gain conversion means for passing an input signal and for varying its gain according to an electrical signal supplied thereto;
   a power amplifier coupled to said gain conversion means for amplifying the power of an output signal from said gain conversion means; and
   a compensation means having temperature detecting means that detects a temperature of said power amplifier for generating from an electrical signal outputted from said temperature detecting means said electrical signal supplied to said gain conversion means so as to thereby compensate for gain variations of said power amplifier with respect to temperature variations so that a total transmission gain of said transmitter is maintained at a constant value;
   wherein said compensation means has an adjusting means for adjusting in advance said electrical signal supplied to said gain conversion means so that said total transmission gain of said transmitter at a reference temperature becomes a predetermined value.

2. A stabilized transmitter comprising;
   a gain conversion means for passing an input intermediate freuency signal and for varying its gain according to an electrical signal supplied thereto;
   a frequency conversion means for converting said intermediate-frequency signal passed through said gain conversion means to a high-frequency signal;
   a power amplifier coupled to said frequency conversion means for amplifying the power of said high-frequency signal so as to thereby obtain a high-frequency transmission signal; and
   a compensation means having a temperature detecting means which detects a temperature of said power amplifier for producing form a detection result of said temperature detecting means said electrical signal supplied to said gain conversion means so as to thereby compensate for variations of the gain of said power amplifier caused by temperature variations so that a total transmission gain of said transmitter is maintained constant, said compensation means having an adjusting means for adjusting in advance said electrical signal supplied to said gain conversion means such that said total transmission gain of said transmitter at a reference temperature becomes a predetermined value.

3. A stabilized transmitter according to claim 2, wherein said gain conversion means comprises a variable attenuator whose attenuation rate is varied according to said electrical signal.

4. A stabilized transmitter comprising:
   a gain conversion means for passing an input high-frequency signal and for varying its gain according to an electrical signal supplied thereto;
   a power amplifier coupled to said gain conversion means for amplifying the power of said high-frequency signal passed through said gain conversion means so as to thereby obtain a high-frequency transmission signal; and
   a compensation means having temperature detecting means which detects a temperature of said power amplifier for producing from a detection result of said temperature detecting means said electrical signal supplied to said gain conversion means so as to thereby compensate for variations of the gain of said power amplifier caused by temperature variations so that a total transmission gain of said transmitter is maintained constant, said compensation means having an adjusting means for adjusting in advance said electrical signal supplied to said gain conversion means such that said total transmission gain of said transmitter at a reference temperature becomes a predetermined value.

5. A stabilized transmitter according to claim 4, wherein said gain conversion means comprises a variable attenuator whose attenuation rate is varied according to said electrical signal.

* * * * *